(12) United States Patent
Schilling et al.

(10) Patent No.: US 12,354,936 B2
(45) Date of Patent: Jul. 8, 2025

(54) SEMICONDUCTOR DEVICE WITH A NICKEL COMPRISING LAYER AND METHOD FOR FABRICATING THE SAME

(71) Applicant: Infineon Technologies AG, Neubiberg (DE)

(72) Inventors: Oliver Schilling, Warstein (DE); Roman Immel, Soest (DE); Joachim Seifert, Schwerte (DE); Altan Toprak, Herten (DE); Frank Wagner, Ruethen (DE); Ulrich Wilke, Soest (DE); Lars Boewer, Soest (DE); Paul Frank, Villach (AT)

(73) Assignee: Infineon Technologies AG, Neubiberg (DE)

( * ) Notice: Subject to any disclaimer, the term of this patent is extended or adjusted under 35 U.S.C. 154(b) by 417 days.

(21) Appl. No.: 17/899,541

(22) Filed: Aug. 30, 2022

(65) Prior Publication Data

US 2023/0063856 A1 Mar. 2, 2023

(30) Foreign Application Priority Data

Aug. 31, 2021 (EP) ..................... 21193956

(51) Int. Cl.
*H01L 23/498* (2006.01)
*H01L 23/00* (2006.01)
(52) U.S. Cl.
CPC .. *H01L 23/49822* (2013.01); *H01L 23/49838* (2013.01); *H01L 23/49866* (2013.01); *H01L 24/08* (2013.01); *H01L 2224/05155* (2013.01); *H01L 2224/08235* (2013.01)
(58) Field of Classification Search
CPC ......... H01L 23/49822; H01L 23/49838; H01L 23/49866
See application file for complete search history.

(56) References Cited

U.S. PATENT DOCUMENTS

| | | | |
|---|---|---|---|
| 6,896,976 B2 | 5/2005 | Cheah | |
| 8,587,116 B2 * | 11/2013 | Hohlfeld | ............... H01L 25/072 257/700 |
| 2008/0079021 A1 * | 4/2008 | Bayerer | ............... H01L 23/473 257/E23.051 |
| 2018/0257179 A1 | 9/2018 | Kitaura et al. | |
| 2020/0105704 A1 | 4/2020 | Behrens et al. | |
| 2021/0138590 A1 | 5/2021 | Watanabe et al. | |

FOREIGN PATENT DOCUMENTS

| | | |
|---|---|---|
| EP | 3461580 A1 | 4/2019 |
| JP | 2001196393 A | 7/2001 |

\* cited by examiner

*Primary Examiner* — Dale E Page
*Assistant Examiner* — Wilner Jean Baptiste
(74) *Attorney, Agent, or Firm* — Murphy, Bilak & Homiller, PLLC

(57) ABSTRACT

A semiconductor device includes a semiconductor die including a first side and an opposing second side, a first metallization layer arranged on the first side, a Ni including layer arranged on the second side, wherein the Ni including layer further includes one or more of Si, Cr and Ti, and a SnSb layer arranged on the Ni comprising layer, wherein an amount of Sb in the SnSb layer is in the range of 2 wt % to 30 wt %.

10 Claims, 4 Drawing Sheets

SEMICONDUCTOR DEVICE WITH A NICKEL COMPRISING LAYER AND METHOD FOR FABRICATING THE SAME

TECHNICAL FIELD

This disclosure relates in general to semiconductor devices as well as to methods for fabricating semiconductor devices.

BACKGROUND

Semiconductor devices comprise semiconductor dies that may be arranged over and electrically coupled to a conductive carrier, e.g. via a metal layer stack, wherein one of these layers is a solder material layer. Such a metal layer stack may have to fulfill several electrical and/or mechanical requirements for the semiconductor device to not fail during typical operations. For example, the metal layer stack may have to have a high reliability vs. thermomechanical stress, a high robustness against soldering temperature stress, low fabrication costs and high yield in fabrication. Typically, these requirements may lead to competing design choices, wherein trying to fulfill one requirement may compromise another. Improved semiconductor devices as well as improved methods for fabricating semiconductor devices may help with solving these and other problems.

The problem on which the invention is based is solved by the features of the independent claims. Further advantageous examples are described in the dependent claims.

SUMMARY

Various aspects pertain to semiconductor device, comprising: a semiconductor die comprising a first side and an opposing second side, a first metallization layer arranged on the first side, a Ni comprising layer arranged on the second side, wherein the Ni comprising layer further comprises one or more of Si, Cr and Ti, and a SnSb layer arranged on the Ni comprising layer, wherein an amount of Sb in the SnSb layer is in the range of 2 wt % to 30 wt %.

Various aspects pertain to a method for fabricating a semiconductor device, the method comprising: providing a semiconductor substrate comprising a first side and an opposing second side, depositing a first metallization layer on the first side, depositing a Ni comprising layer on the second side, and depositing a SnSb layer on the Ni comprising layer, wherein an amount of Sb in the SnSb layer is in the range of 2 wt % to 30 wt %.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

DETAILED DESCRIPTION

Figure 1:
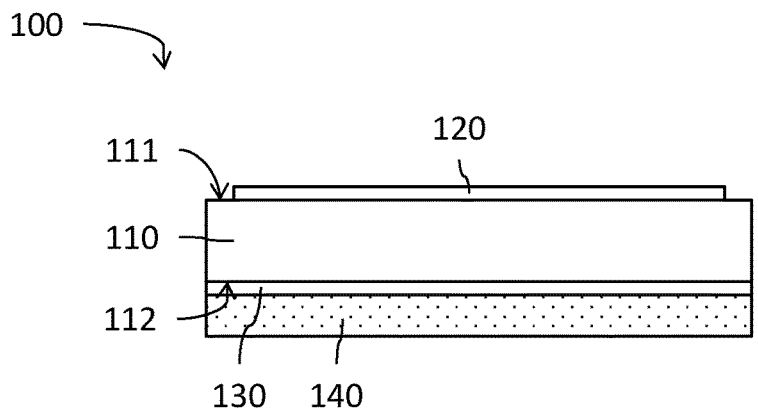
FIG. 1 shows a sectional view of an exemplary semiconductor device comprising a Ni comprising layer or Ni alloy layer and a SnSb layer.

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a semiconductor device described below may use various types of semiconductor chips or circuits incorporated in the semiconductor chips, among them AC/DC or DC/DC converter circuits, power MOS transistors, power Schottky diodes, JFETs (Junction Gate Field Effect Transistors), power bipolar transistors, logic integrated circuits, analogue integrated circuits, power integrated circuits, etc. The examples may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

The semiconductor chip(s) can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

Further, an "alloy of X" (including further components Y, Z, . . . ) means that X is the majority component of the alloy, i.e. the contribution of X in weight percent is greater than the contribution of Y in weight percent and the contribution of Z in weight percent, respectively. In particular, it may mean that the contribution of X is at least 50 wt %. The same applies to solder compositions.

The notation XY refers to an alloy of X including at least Y as a further component. In particular, it may refer to an alloy of X including Y as a sole residual component (i.e. a closed composition). That is, in the second case, the notation XY means that the alloy XY has a composition consisting of X (of the percentage in weight of X) and Y (of the percentage in weight of Y), the balance being only inevitable elements. The notation XYZ . . . has an analogous meaning, i.e. an "open composition" or a "closed composition" with X, Y, Z, . . . forming the sole constituents of the alloy (except inevitable elements). The same applies to solder compositions.

FIG. 1 shows a semiconductor device 100 comprising a semiconductor substrate 110, a first metallization layer 120, a Ni comprising layer (or Ni alloy layer) 130 and a SnSb layer 140.

The semiconductor substrate 110 comprises a first side 111 and an opposing second side 112 and the first metallization layer 120 is arranged on the first side 111. The Ni comprising layer 130 is arranged on the second side 112 of the semiconductor substrate 110 and the SnSb layer 140 is arranged on the Ni comprising layer. Furthermore, a Sb content in the SnSb layer 140 is in the range of 2 wt % to 30 wt %, wherein the remaining material of the SnSb layer 140 consists of Sn and impurities and/or additives.

The semiconductor substrate 110 may for example comprise a semiconductor wafer, a semiconductor panel or a (singulated) semiconductor die. The semiconductor substrate 110 may in particular comprise a power semiconductor device like a power transistor or diode, wherein a first power electrode (e.g. a source, drain, emitter, or collector electrode) is arranged on the first side 111 and electrically coupled to the first metallization layer and a second power electrode is arranged on the second side 112 and electrically coupled to the Ni comprising layer 130. A control electrode, e.g. a gate electrode, may also be arranged on the first side 111. The control electrode may be covered by a part of the first metallization layer 120.

The semiconductor substrate 110 may e.g. comprise or consist of Si or SiC. The semiconductor substrate 110 may have any suitable thickness measured between the first and second sides 111, 112, e.g. a thickness of 50 µm or more, 100 µm or more, 150 µm or more, 200 µm or more, or 300 µm or more.

The first metallization layer 120 may comprise any suitable metal or metal alloy and it may e.g. comprise one or more of Al, Cu, or Fe. The first metallization layer 120 may for example be deposited on the first side 111 by sputtering, evaporation or by electroplating. The first metallization layer 120 may completely cover the first side 111 or it may cover the first side 111 only partially, as shown in the example of FIG. 1.

The first metallization layer 120 may have any suitable thickness measured perpendicular to the first side 111, e.g. a thickness of 100 nm or more, or 1 µm or more, 5 µm or more, or 10 µm or more.

The Ni comprising layer 130 may for example comprise or completely consist of Ni and Si, except for unavoidable impurities (in other words, the Ni comprising layer 130 may be a NiSi layer). According to another example, the Ni comprising layer 130 may comprise or consist of NiCr or NiTi. More generally speaking, the Ni comprising layer 130 may comprise any material or material composition which allows sputtering. The Ni comprising layer 130 may completely cover the second side 112 of the semiconductor substrate 110, or it may cover the second side 112 only partially. The Ni comprising layer 130 may be arranged directly on the second side 112 or there may be one or more further metal layers arranged between the second side 112 and the Ni comprising layer 130, as described further below.

According to an example, the first metallization layer 120 is a front side metallization of the semiconductor substrate 110 and the Ni comprising layer 130 is a back side metallization of the semiconductor substrate 110.

The Ni comprising layer 130 may have any suitable thickness measured perpendicular to the second side, e.g. a thickness in the range of 100 nm to 1 µm. A thickness in this range may be comparatively small and it may therefore result in a low chip bow or wafer bow. Furthermore, it may enable a high throughput sputtering process for the fabrication of the Ni comprising layer 130. The Ni comprising layer 130 may e.g. be deposited on the semiconductor substrate 110 by a sputtering process, which may be a comparatively cost efficient deposition technique.

According to an example, a Si content or a Cr content or a Ti content in the Ni comprising layer 130 may be in the range of 1 wt % to 10 wt %. A Si content or Cr content or Ti content in this range may enable a high throughput sputtering process for the fabrication of the Ni comprising layer 130.

The SnSb layer 140 may be arranged directly on the Ni comprising layer 130. The SnSb layer 140 may be configured as a solder layer. The SnSb layer 140 may for example be deposited on the Ni comprising layer 130 in the form of a solder paste or in the form of a solder preform.

According to an example, the SnSb layer 140 has a thickness perpendicular to the second side 112 in the range of 1 µm to 200 µm. A SnSb layer 140 with such a (comparatively low) thickness may advantageously have a comparatively low thermal and/or electrical resistance.

Figure 2:
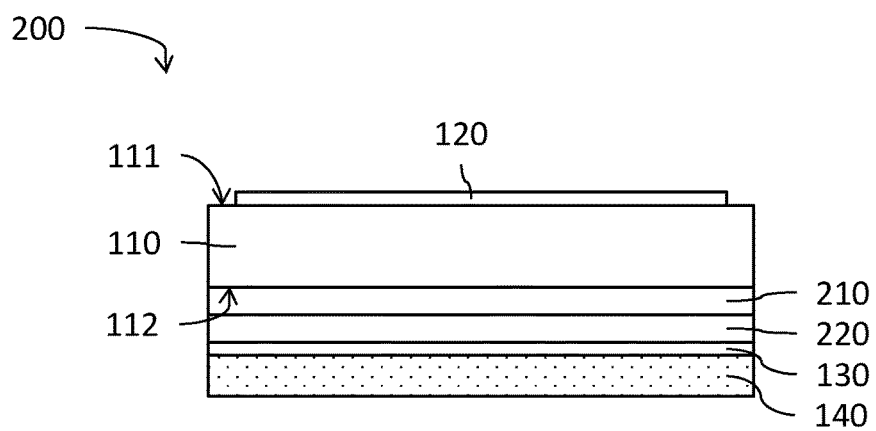
FIG. 2 shows a sectional view of a further exemplary semiconductor device that comprises additional metal layers arranged between the Ni comprising layer or Ni alloy layer and the semiconductor substrate.

FIG. 2 shows a further semiconductor device 200 which may be similar to or identical with the semiconductor device 100, except for the differences described in the following.

The semiconductor device 200 comprises all components of the semiconductor device 100 and it may additionally comprise a first additional metal layer 210. The first additional metal layer 210 may be arranged between the second side 112 of the semiconductor substrate 110 and the Ni comprising layer 130. The first additional metal layer 210 may for example be arranged directly on the second side 112.

According to an example, the first additional metal layer 210 is configured as a contact layer. The first additional metal layer 210 may for example comprise or consist of Al.

According to an example, the Ni comprising layer 130 may be arranged directly on the first additional metal layer 210.

The semiconductor device 200 may comprise a second additional metal layer 220. The second additional metal layer 220 may be arranged between the second side 112 and the Ni comprising layer 130. The second additional metal layer 220 may optionally be arranged between the first additional metal layer 210 and the Ni comprising layer 130. The Ni comprising layer 130 may be arranged directly on the second additional metal layer 220.

The second additional metal layer 220 may for example be configured as a (diffusion) barrier layer. The second additional metal layer 220 may e.g. comprise or consist of Ti or Cr.

The first and second additional metal layers 210, 220 may each have any suitable thickness measured perpendicular to the second side 112, e.g. a thickness in the range of 100 nm to 1 μm. The first and second additional metal layers 210, 220 may e.g. be deposited on the semiconductor substrate 110 by a sputtering process.

According to an example, the semiconductor device 200 comprises the first additional metal layer 210 but not the second additional metal layer 220. According to another example, the semiconductor device 200 comprises the second additional metal layer 220 but not the first additional metal layer 210. According to yet another example, the semiconductor device 200 comprises both the first and second additional metal layers 210, 220. It is also possible that the semiconductor device 200 comprises further (different) additional metal layers which may be arranged between the second side 112 and the Ni comprising layer 130.

Figure 3:
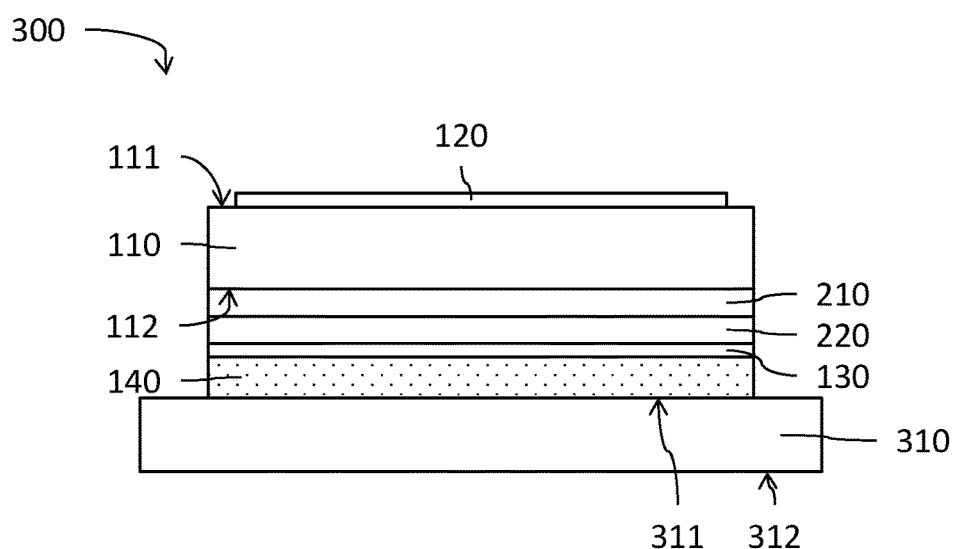
FIG. 3 shows a sectional view of a further exemplary semiconductor device, wherein the semiconductor substrate is arranged on a carrier.

FIG. 3 shows a further semiconductor device 300 which may be similar to or identical with the semiconductor devices 100 and 200. In the example shown in FIG. 3, the semiconductor device 300 comprises the first and second additional metal layers 210 and 220. However, it is also possible that the semiconductor device 300 does not comprise these layers or that it comprises only one of these layers but not both.

The semiconductor device 300 comprises all components of the semiconductor device 100 and it additionally comprises a carrier 310, wherein the SnSb layer 140 is arranged on the carrier 310. The carrier 310 comprises a first side 311 and an opposing second side 312 and the SnSb layer 140 may be arranged on the first side 311.

The carrier 310 may e.g. be a device carrier and it may comprise a direct copper bond (DCB) type substrate or a leadframe. The carrier 310 may for example comprise or consist of Cu. The carrier 310 may have any suitable thickness measured between the first and second sides 311, 312, for example a thickness of 100 μm or more, 500 μm or more, 1 mm or more, or 5 mm or more.

The SnSb layer 140 may in particular be in direct contact with the first side 311. The first side 311 may comprise or consist of Cu. The first side 311 may in particular be free of any Ni coating. The SnSb layer 140 may cover the first side 311 only partially, as shown in the example of FIG. 3, or it may cover the first side 311 completely.

The semiconductor substrate 110 is electrically and mechanically coupled to the carrier 310 by the SnSb layer 140. The SnSb layer 140 may in particular comprise a solder joint which couples the semiconductor substrate 110 to the carrier 310. The solder joint may be a soft solder joint according to an example and it may be a diffusion solder joint according to another example.

The Si content or Cr content or Ti content of the Ni comprising layer 130 of the semiconductor device 300 may be higher than the Si content or Cr content or Ti content of the Ni comprising layer 130 of the semiconductor devices 100 and 200. For example, the Si content or Cr content or Ti content of the Ni comprising layer 130 of the semiconductor device 300 may be 30 wt % or more, 40 wt % or more, or 50 wt % or more. This increase in the Si or Cr or Ti content may be due to the soldering process by which the semiconductor substrate 110 is soldered to the carrier 310. In particular, a Ni content of the Ni comprising layer 130 may be "consumed" in the soldering process, thereby increasing the Si or Cr or Ti content, relatively speaking.

According to an example, the semiconductor device 300 further comprises an encapsulation encapsulating the semiconductor substrate 110. The encapsulation may e.g. comprise a molded body or a hard plastic frame. The encapsulation may e.g. be configured to protect the semiconductor substrate from moisture or dust particles.

Figure 4:
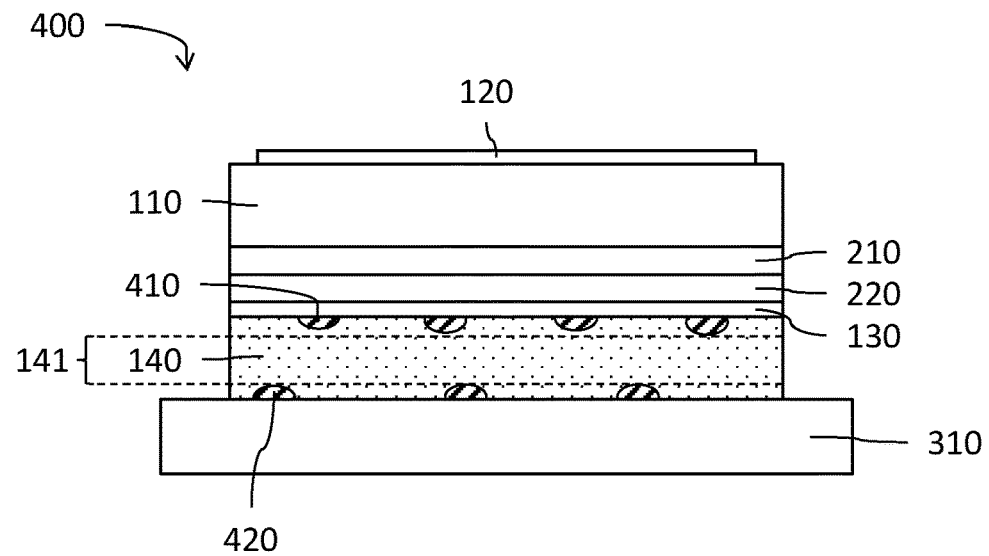
FIG. 4 shows a sectional view of a further exemplary semiconductor device, wherein a solder joint comprises intermetallic phases.

FIG. 4 shows a further semiconductor device 400 which may be similar to or identical with the semiconductor device 300, except for the differences described in the following.

The semiconductor device 400 comprises all components of the semiconductor device 300 and it additionally comprises a first intermetallic phase 410 and a second intermetallic phase 420. The first intermetallic phase 410 may e.g. be arranged predominantly or solely at a first interface between the Ni comprising layer 130 and the SnSb layer 140. The second intermetallic phase 420 may be arranged predominantly or solely at a second interface between the SnSb layer 140 and the carrier 310. However, it is also possible that the first intermetallic phase 410 and/or the second intermetallic phase 420 essentially extends through the whole thickness of the SnSb layer 140 or at least through a large portion of the thickness of the SnSb layer 140.

The expression "arranged at an interface" may carry the meaning that an inner core 141 of the SnSb layer 140 is free or almost free of the first and/or second intermetallic phase 410, 420. The inner core 141 may comprise 50% or more, or 70% or more, or 90% or more of the thickness of the SnSb layer 140.

According to an example, the first intermetallic phase 410 has a material composition that is different from a material composition of the second intermetallic phase 420. For example, the first intermetallic phase 410 may comprise Ni and Sn, e.g. in the form of $Ni_3Sn_4$. The second intermetallic phase 420 may e.g. comprise Cu and Sn, e.g. in the form of $Cu_3Sn$. According to another example, both intermetallic phases 410, 420 have identical material compositions.

An intermetallic phase comprising $Ni_3Sn_4$ may be comparatively brittle which may be detrimental if such a phase were arranged at the second interface between the SnSb layer 140 and the carrier 310. An Sn/Sb layer 140 with a high Sb content, for example in the range of 17 wt % to 90 wt % could be used to prevent the formation of such brittle $Ni_3Sn_4$ phases. However, in the semiconductor device 400 $Ni_3Sn_4$ phases may not be particularly problematic, for example because the carrier 310 does not comprise Ni. At least for this reason, a SnSb layer 140 with a comparatively low Sb content, e.g. in the range of 2 wt % to 30 wt %, may be used without negative impact on the mechanical robustness of a solder joint created by the SnSb layer 140. Furthermore, a SnSb layer 140 with a comparatively lower Sb content may exhibit a smaller thermal resistance than a SnSb layer with a comparatively higher Sb content.

The first and second intermetallic phases 410, 420 may be a product of the soldering process used to couple the semiconductor substrate 110 to the carrier 310. The first intermetallic phase 410 may form by the SnSb layer 140 reacting with the Ni comprising layer 130 during soldering and the second intermetallic phase 420 may form by the SnSb layer 140 reacting with the carrier 310. The first and second intermetallic phases 410, 420 may have any shape and any dimensions defined by the specific soldering process used, for example they may be individual corns or contiguous layers along the first and second interfaces, or anything in between. According to an example, it is also possible that the SnSb layer 140 only reacts with the carrier 310 and forms the second IMC 420 but does not react with the Ni comprising layer 130 to form the first IMC 410. According to yet another example, it is also possible that the SnSb layer 140 only reacts with the Ni comprising layer 130 and forms the first IMC 410 but does not react with the carrier 310 to form the second IMC 420.

FIGS. 5A to 5F show the semiconductor device 400 in various stages of fabrication according to an exemplary method for fabricating semiconductor devices. Similar methods may be used to fabricate the semiconductor devices 100, 200 and 300.

Figure 5A:
FIGS. 5A to 5F show a semiconductor device in various stages of fabrication according to an exemplary method for fabricating semiconductor devices.

As shown in FIG. 5A, the semiconductor substrate 110 is provided. The semiconductor substrate 110 may e.g. be provided in the form of a wafer, a panel, or a die. In particular in the case that the semiconductor wafer 110 is a die, providing the substrate 110 may comprise singulating the die from a wafer.

Figure 5B:
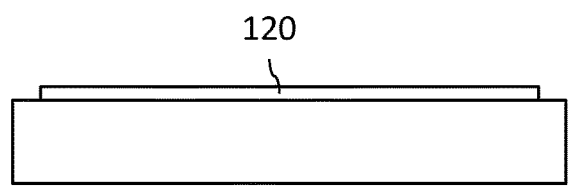

As shown in FIG. 5B, the first metallization layer 120 is deposited on the first side 111 of the semiconductor substrate 110. This may e.g. comprise sputtering the first metallization layer 120 onto the first side 111.

Figure 5C:
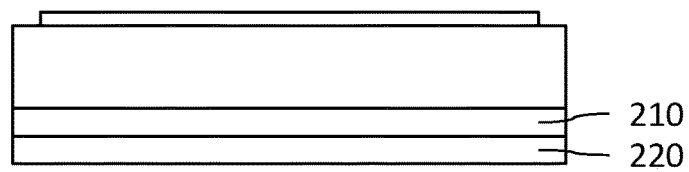

FIG. 5C shows an optional act of depositing the first and second additional metal layers 210, 220 on the second side 112 of the semiconductor substrate 110. This may e.g. comprise sputtering the first and second additional metal layers 210, 220 onto the second side 112. The first and second additional metal layers 210, 220 may be deposited after the first metallization layer 120 has been deposited, they may be deposited simultaneously with it or they may be deposited prior to depositing the first metallization layer 120.

Figure 5D:
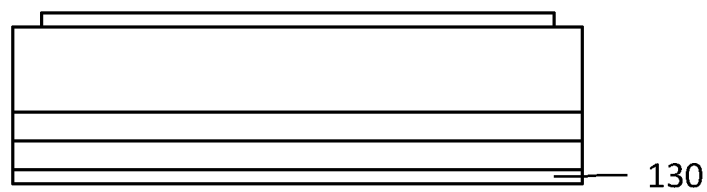

As shown in FIG. 5D, the Ni comprising layer 130 is deposited on the semiconductor substrate 110, either directly on the second side 112, directly on the first additional metal layer 210, or directly on the second additional metal layer 220 (as shown in the example of FIG. 5D). Depositing the Ni comprising layer 130 may comprise a sputtering process. The Ni comprising layer 130 may be deposited after depositing the first metallization layer 120 or prior to depositing the first metallization layer 120.

Figure 5E:
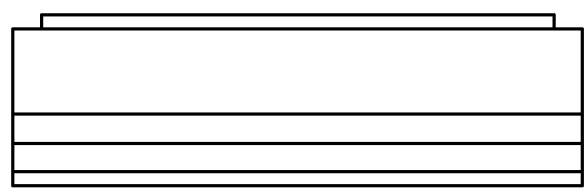
Figure 5E:
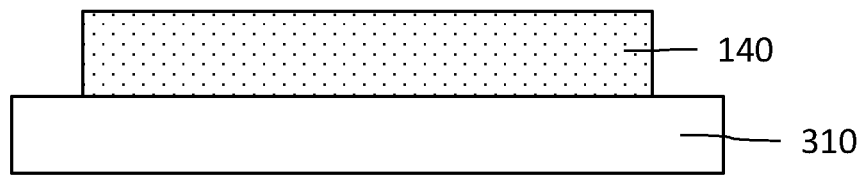

As shown in FIG. 5E, the SnSb layer 140 is provided and arranged on the Ni comprising layer 130. Arranging the SnSb layer 140 on the Ni comprising layer 130 may comprise applying (e.g. spraying) an SnSb solder paste onto a carrier 310 and then bringing the thus formed SnSb 140 layer into contact with the Ni comprising layer 130. Alternatively, SnSb solder material may be deposited as a (semi-rigid) preform on the carrier 310. According to yet another example, the SnSb layer 140 is deposited directly on the Ni comprising layer 130 instead of on the carrier 310.

Figure 5F:
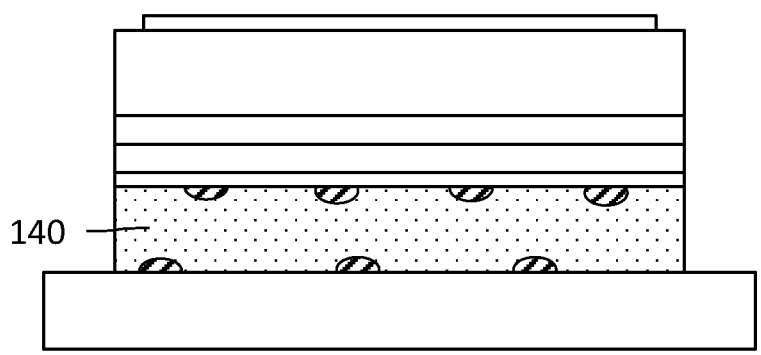

As shown in FIG. 5F, a soldering process is used to electrically and mechanically couple the semiconductor substrate 110 to the carrier 310, thereby turning the SnSb layer 140 into a solder joint. The first and second intermetallic phases 410, 420 may form as a result of the soldering process. The soldering process may e.g. comprise applying a temperature in the range of 250° C. to 300° C., for example a temperature of about 270° C. or more to the SnSb layer 140.

According to an example, the semiconductor substrate is encapsulated in an encapsulation after it has been coupled to the carrier 310.

The SnSb layer 140 may in particular be directly arranged on and soldered to a Cu surface of the carrier 310. For example, the SnSb layer 140 may be directly arranged on and soldered to Cu bulk material of the carrier 310. According to another example, the SnSb layer 140 may be directly arranged on and soldered to a Cu coating of the carrier 310.

Figure 6:
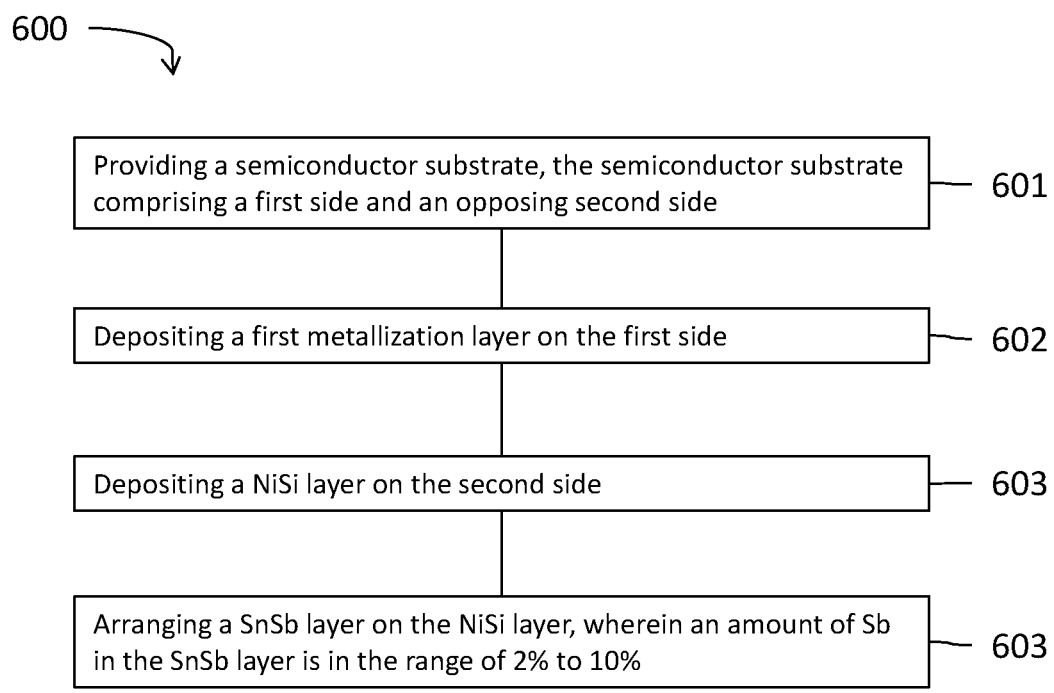
FIG. 6 is a flow chart of an exemplary method for fabricating semiconductor devices.

FIG. 6 is a flow chart of a method 600 for fabricating a semiconductor device. The method 600 may for example be used for fabricating the semiconductor devices 100, 200, 300 and 400.

The method 600 comprises at 601 an act of providing a semiconductor substrate, the semiconductor substrate comprising a first side and an opposing second side, at 602 an act of depositing a first metallization layer on the first side, at 603 an act of depositing a Ni comprising layer on the second side, and at 604 an act of arranging a SnSb layer on the Ni comprising layer, wherein an amount of Sb in the SnSb layer is in the range of 2 wt % to 30 wt %.

According to an example, the method 600 further comprises an act of arranging the semiconductor substrate on a carrier such that the SnSb layer is in contact with a first side of the carrier, and soldering the semiconductor substrate to the carrier. The first side of the carrier may comprise or consist of Cu.

In the following, the semiconductor device and the method for fabricating a semiconductor device are further explained using specific examples.

Example 1 is a semiconductor device, comprising: a semiconductor die comprising a first side and an opposing second side, a first metallization layer arranged on the first side, a Ni alloy layer arranged on the second side, wherein the Ni alloy layer further comprises one or more of Si, Cr and Ti, and a SnSb layer arranged on the Ni alloy layer, wherein an amount of Sb in the SnSb layer is in the range of 2 wt % to 30 wt %.

Example 2 is the semiconductor device of example 1, wherein an amount of Si in the Ni alloy layer is in the range of 1 wt % to 10 wt %.

Example 3 is the semiconductor device of example 1 or 2, further comprising: a barrier metal layer arranged between the second side and the Ni alloy layer.

Example 4 is the semiconductor device of one of the preceding examples, further comprising: a contact metal layer arranged between the second side and the Ni alloy layer.

Example 5 is the semiconductor device of one of the preceding examples, wherein the SnSb layer has a thickness measured perpendicular to the first and second sides in the range of 1 μm to 200 μm.

Example 6 is the semiconductor device of one of the preceding examples, wherein the Ni alloy layer has a thickness measured perpendicular to the first and second sides in the range of 100 nm to 1 μm.

Example 7 is the semiconductor device of one of the preceding examples, further comprising: a carrier comprising a first main face, wherein the SnSb layer is arranged directly on the first main face, and wherein the first main face comprises Cu.

Example 8 is the semiconductor device of example 7, wherein the carrier comprises a DCB or a leadframe.

Example 9 is the semiconductor device of example 7 or 8, further comprising: a first intermetallic phase comprising Ni and Sn, and/or a second intermetallic phase comprising Cu and Sn.

Example 10 is the semiconductor device of example 9, wherein the first intermetallic phase is essentially arranged at a first interface between the Ni alloy layer and the SnSb layer and wherein the second intermetallic phase is essentially arranged at a second interface between the SnSb layer and the first main face.

Example 11 is a method for fabricating a semiconductor device, the method comprising: providing a semiconductor substrate comprising a first side and an opposing second side, depositing a first metallization layer on the first side, sputtering a Ni comprising layer onto the second side, and arranging a SnSb layer on the Ni comprising layer, wherein an amount of Sb in the SnSb layer is in the range of 2 wt % to 30 wt %.

Example 12 is the method of example 11, further comprising: providing a carrier comprising a first main face, wherein the first main face comprises Cu, wherein arranging the SnSb layer on the Ni comprising layer comprises depositing the SnSb layer on the first main face and then bringing the SnSb layer into contact with the Ni comprising layer, and soft soldering the SnSb layer directly onto the first main face and the Ni comprising layer.

Example 13 is the method of example 12, wherein the SnSb layer has a thickness in the range of 1 µm to 200 µm, measured perpendicular to the first and second sides.

Example 14 is the method of one of examples 12 or 13, wherein the SnSb layer is deposited directly onto a bulk material of the carrier.

Example 15 is the method of one of claims 11 to 14, wherein the Ni comprising layer further comprises one or more of Si, Cr and Ti.

Example 16 is an apparatus comprising means for performing the method of one of examples 11 to 15.

An efficient semiconductor device and an efficient method for fabricating semiconductor devices may for example reduce material consumption, chemical waste and/or ohmic losses and thus enable energy and/or resource savings. Improved semiconductor devices and improved methods for fabricating semiconductor devices, as specified in this description, may thus at least indirectly contribute to green technology solutions, i.e. climate-friendly solutions providing a mitigation of energy and/or resource use.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:

1. A semiconductor device, comprising:
a semiconductor die comprising a first side and an opposing second side,
a first metallization layer arranged on the first side,
a Ni alloy layer arranged on the second side, wherein the Ni alloy layer further comprises one or more of Si, Cr and Ti, and
a SnSb layer arranged on the Ni alloy layer,
wherein an amount of Sb in the SnSb layer is in the range of 2 wt % to 30 wt %.

2. The semiconductor device of claim 1, wherein an amount of Si in the Ni alloy layer is in the range of 1 wt % to 10 wt %.

3. The semiconductor device of claim 1, further comprising:
a barrier metal layer arranged between the second side and the Ni alloy layer.

4. The semiconductor device of claim 1, further comprising:
a contact metal layer arranged between the second side and the Ni alloy layer.

5. The semiconductor device of claim 1, wherein the SnSb layer has a thickness in the range of 1 µm to 200 µm, measured perpendicular to the first and second sides.

6. The semiconductor device of claim 1, wherein the Ni alloy layer has a thickness measured perpendicular to the first and second sides in the range of 100 nm to 1 µm.

7. The semiconductor device of claim 1, further comprising:
a carrier comprising a first main face, wherein the SnSb layer is arranged directly on the first main face, and wherein the first main face comprises Cu.

8. The semiconductor device of claim 7, wherein the carrier comprises a DCB or a leadframe.

9. The semiconductor device of claim 7, further comprising:
a first intermetallic phase comprising Ni and Sn, and/or
a second intermetallic phase comprising Cu and Sn.

10. The semiconductor device of claim 9, wherein the first intermetallic phase is essentially arranged at a first interface between the Ni alloy layer and the SnSb layer and wherein the second intermetallic phase is essentially arranged at a second interface between the SnSb layer and the first main face.

* * * * *